US008854868B2

(12) United States Patent
Cao et al.

(10) Patent No.: US 8,854,868 B2
(45) Date of Patent: Oct. 7, 2014

(54) SENSE AMPLIFIER

(71) Applicant: International Business Machines Corporation, Armonk, NY (US)

(72) Inventors: Hai Tao Cao, Shanghai (CN); Xiao Li Hu, Shanghai (CN); Qing Ql Li, Shanghai (CN); Huan Shi, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/955,368

(22) Filed: Jul. 31, 2013

(65) Prior Publication Data

US 2014/0036579 A1    Feb. 6, 2014

(30) Foreign Application Priority Data

Jul. 31, 2012   (CN) .......................... 2012 1 0269372

(51) Int. Cl.
*G11C 11/40* (2006.01)
*G11C 7/06* (2006.01)
*G11C 11/419* (2006.01)
*G11C 11/4091* (2006.01)
*G11C 11/4093* (2006.01)

(52) U.S. Cl.
CPC .............. *G11C 7/062* (2013.01); *G11C 11/419* (2013.01); *G11C 11/4091* (2013.01); *G11C 11/4093* (2013.01)
USPC ....................... 365/154; 365/189.15; 365/207

(58) Field of Classification Search
CPC ........ G11C 7/06; G11C 7/062; G11C 7/1051; G11C 7/12; G11C 11/40
USPC .............................. 365/154, 189.15, 205, 207
See application file for complete search history.

(56) References Cited

U.S. PATENT DOCUMENTS

| 7,212,460 | B1 * | 5/2007 | Jung et al ...................... 365/207 |
| 7,280,401 | B2 | 10/2007 | DiGregorio et al. |
| 7,613,054 | B2 | 11/2009 | Lee et al. |
| 7,791,976 | B2 | 9/2010 | Rao et al. |
| 8,004,907 | B2 * | 8/2011 | Russell et al. ......... 365/189.011 |
| 8,116,149 | B2 | 2/2012 | Chen et al. |
| 8,213,251 | B2 * | 7/2012 | Yun et al. ...................... 365/207 |
| 2004/0037139 | A1 | 2/2004 | Shimizu |
| 2009/0153262 | A1 | 6/2009 | Kang et al. |
| 2012/0008379 | A1 | 1/2012 | Chan et al. |

OTHER PUBLICATIONS

Zhang, K. et al.—"A Fully Synchronized, Pipelined, and Re-Configurable 50Mb SRAM on 90nm CMOS Technology for Logic Applications"—2003 Symposium on VLSI Circuits Digest of Technical Papers—Jun. 12, 2003 Publication Date.
Qazi, M. et al.—"A 512KB 8T SRAM macro operating down to 0.57V with an AC-coupled sense amplifier and embedded data-retention-voltage sensor in 45nm SOI CMOS"—Published Jul. 29, 2012—Massachusetts Institute of Technology.
Puttaswamy, K, et al.—3D Integrated SRAM Components for High-Performance Microprocessors—Computers, IEEE Transactions—Oct. 2009.

* cited by examiner

*Primary Examiner* — Tan T. Nguyen
(74) *Attorney, Agent, or Firm* — Joseph P. Abate

(57) ABSTRACT

Embodiments of the invention provide a sense amplifier, a SRAM chip comprising the sense amplifier and a method of performing read operation on the SRAM chip. The sense amplifier according to embodiments of the invention comprises an additional driving assist portion, which further takes a global data bus as input, the driving assist portion is configured to enable the sense amplifier to provide assisted driving for other sense amplifiers. With the solution according to embodiments of the invention, driving capability of a sense amplifier on global data bus can be enhanced.

9 Claims, 7 Drawing Sheets

SENSE AMPLIFIER

This application claims priority under 35 U.S.C. §119 from Chinese Patent Application No. 201210269372.5 filed Jul. 31, 2012, the entire contents of which are incorporated herein by reference.

TECHNICAL FIELD

The invention relates to circuit technology, more particularly, to sense amplifier.

BACKGROUND

Static random access memory (SRAM) is an important type of memory. FIG. 1 is a typical configuration of SRAM. The SRAM cell in FIG. 1 is a basic unit for storing logic value in a SRAM chip and is selected via WLn, and data write and data read are conducted via two bitlines BL and BLb. During read operation, the SRAM cell outputs a pair of complementary signals on BL and BLb, that is, potential of BL is higher than that of BLb, or potential of BL is lower than that of BLb, thereby indicating logic value 0 or 1 stored in that SRAM cell.

Potential difference between the complementary signals on BL and BLb is relatively small, it is only several tens to one hundred millivolts (mVs) in general, and is much smaller than potential difference between logic high level and logic low level in a typical digital circuit. Therefore, driving capability of a SRAM cell itself is limited, and can not meet the requirement of driving post-stage logic circuit. A sense amplifier is used to process signals output on BL and BLb. The sense amplifier is generally multiplexed by a plurality of SRAM cells. Outputs of these SRAM cells, i.e. BL and BLb in FIG. 1, are connected to inputs of the sense amplifier, i.e. DLT and DLC in FIG. 1, via a bitline selection switch circuit. The sense amplifier performs differential amplification on the two inputted signals and then outputs the amplified signal. For example, if signal level on DLT is higher than that on DLC, an output terminal OUT of the sense amplifier outputs logic high level; if signal level on DLT is lower than that on DLC, the output terminal OUT of the sense amplifier outputs logic low level. Driving capability of the sense amplifier is stronger and thus can drive post-stage logic circuit.

Signal outputted from the sense amplifier reaches an output pin of a chip via a global data bus GBL. For a high density SRAM device, GBL is relatively long, thereby having large parasitic resistance and parasitic capacitance. Accordingly, the delay from sense amplifier establishing a stable output to pin of the chip establishing a stable output is also relatively long. This affects improvement in SRAM speed. Thus, there is a need to reduce the delay.

SUMMARY

Embodiments of the invention provide a sense amplifier, a SRAM chip comprising the sense amplifier and a method of performing read operation on the SRAM chip.

The sense amplifier according to embodiments of the invention comprising: a resolving portion, input of which is connected to output of a storage cell corresponding to the sense amplifier, and output of which is connected to input of a driving assist portion; an output portion, input of which is connected to output of the driving assist portion, and output of which is connected to a global data bus of a chip; the driving assist portion, which further takes the global data bus as input, the driving assist portion is configured to cause the output portion to output high level in following conditions; a logic value stored in the storage cell corresponds to outputting high level on the global data bus while a read operation is performed on the storage cell corresponding to the sense amplifier; at least one other sense amplifier that outputs to the same global data bus as the sense amplifier outputs high level while the storage cell corresponding to the sense amplifier is not being accessed.

A SRAM chip according to embodiments of the invention comprises the sense amplifier.

A method of performing read operation on a SRAM chip according to embodiments of the invention comprising: connecting bitline of a selected SRAM cell to input of a sense amplifier, so as to determine output of the sense amplifier based on a logic value stored in the SRAM cell; causing at least one other sense amplifier that outputs to the same global data bus as the sense amplifier to also output high level in case that the sense amplifier outputs high level.

According to the technical solution provided by embodiments of the invention, driving capability of a sense amplifier on global data bus can be enhanced, such that the speed of establishing a stable output at output pin of a chip is increased.

DETAILED DESCRIPTION

Figure 1:
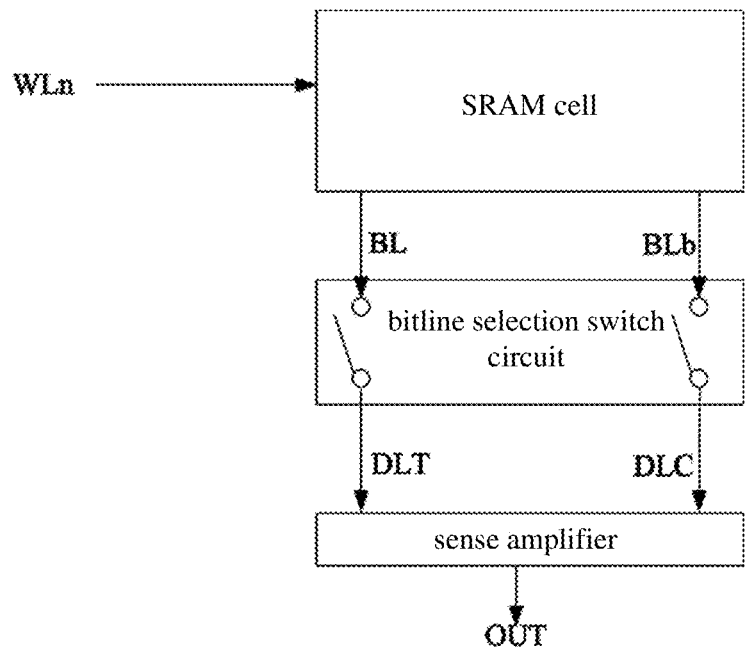
FIG. 1 is a typical circuit in which a SRAM cell cooperates with a sense amplifier.

The invention will be described below by referring to drawings and in conjunction with embodiments. Such description is merely for illustration, and is not intended to limit the scope of the invention. The drawings are only for purpose of illustration and thus are not drawn to scale. Further, when a first element is described as connected to a second element, the first element not only can be connected directly to the second element, but also can be connected indirectly to the second element via a third element. Further, for clarity, some elements which are not necessary to fully understand the invention are omitted for brevity. In the drawings, similar and corresponding elements are represented by similar reference numbers.

Those skilled in the art can appreciate that, level and device type has symmetric relationship in a digital circuit. For example, turn-on level of a N-type transistor is high level, while turn-on level of a P-type transistor is low level. Thus, conditions on high and low level mentioned in the following description may be changed by altering type of relevant devices. Further, the mentioned conditions may also be changed by incorporating additional devices. For example, for a N-type transistor that is turned on at high level, if a NOT gate device is added between gate and input signal of the N-type transistor, then the transistor may be turned on when input signal is low level. All these variations are equivalent to embodiments of the invention described blow and fall into protection scope of the present patent.

Figure 2A:
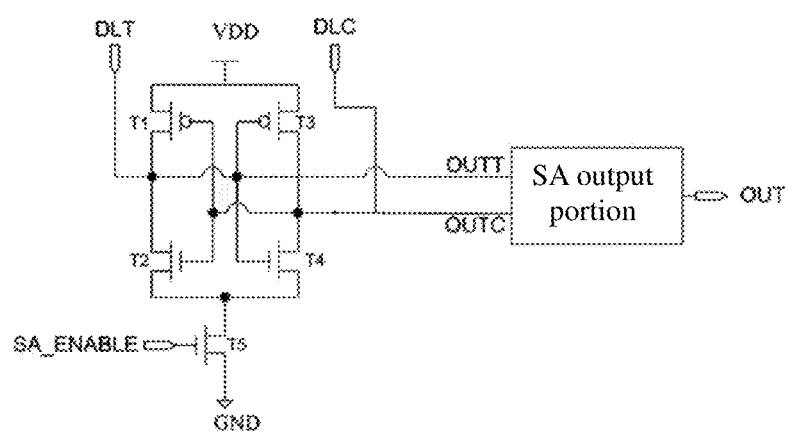
FIGS. 2A, 2B and 2C are diagrams of a sense amplifier.

FIG. 2A shows a structural diagram of a sense amplifier.

In FIG. 2A, a resolving portion of the sense amplifier is a circuit comprising P-type transistors T1, T3 and N-type transistors T2, T4, T5, in which T1, T2, T3 and T4 constitute a cross coupling circuit, and T5 is referred to as tail current transistor. Gates of transistors T1 and T2 are connected at a first node, drains of transistors T1 and T2 are connected at a second node, gates of transistors T3 and T4 are connected at the second node, drains of transistors T3 and T4 are connected at the first node, sources of transistors T1 and T3 are connected to power supply level, sources of transistors T2 and T4 are connected to drain of transistor T5, source of transistor T5 is connected to reference level GND, gate of transistor T5 is connected to an enable signal SA_ENABLE of the sense amplifier, the first node and the second node are connected to two inputs DLC and DLT of the sense amplifier respectively and further connected to output portion of the sense amplifier respectively.

The sense amplifier shown in FIG. 2A comprises four terminals, in addition to the DLT, DLC and OUT mentioned above, there is a SA_ENABLE terminal. This terminal is used to enable the sense amplifier. When this terminal is at high level, tail current transistor T5 is turned on, forming a discharge path between T2, T4 and reference level GND. The sense amplifier starts to perform resolving and establish output according to level of input signal.

Those skilled in the art can further alter the sense amplifier shown in FIG. 2A in various ways. For example, in FIG. 2B, a pre-charge circuit of the sense amplifier comprising transistors T10, T11, T12 and a corresponding terminal PRECHARGE is added for pre-charging the sense amplifier before it starts to operate, so as to increase speed of the sense amplifier.

Figure 2B:
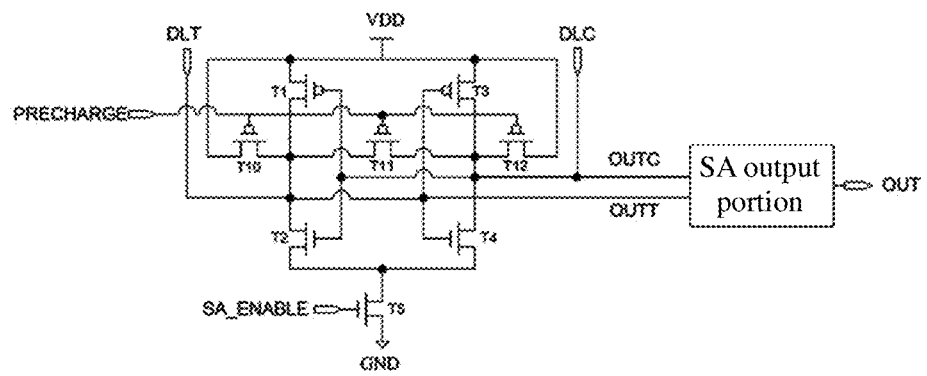
Figure 2C:
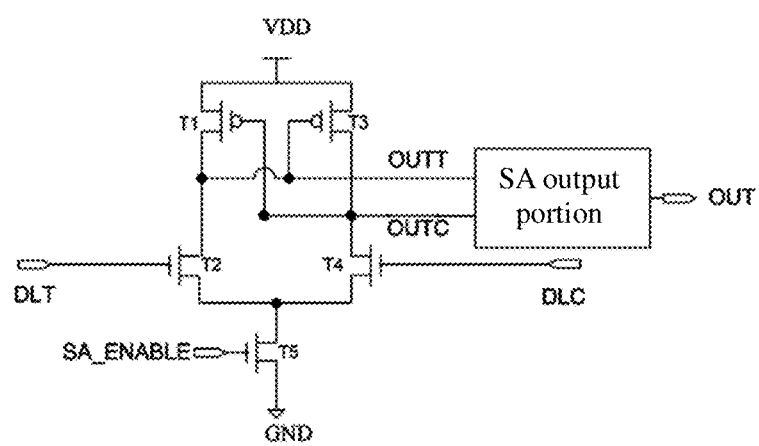

FIG. 2C is a diagram of another sense amplifier. It can be seen that, the circuit shown in FIG. 2A can be obtained by connecting gate of N-type transistor T2 to gate of P-type transistor T1 in FIG. 2C, and connecting gate of N-type transistor T4 to gate of P-type transistor T2 in FIG. 2C. The circuit shown in FIG. 2C can be improved in the same way as in FIG. 2B, which will be omitted for brevity.

As an example, the structure shown in FIG. 2B will be used as a resolving portion of a sense amplifier for description below.

Figure 3:
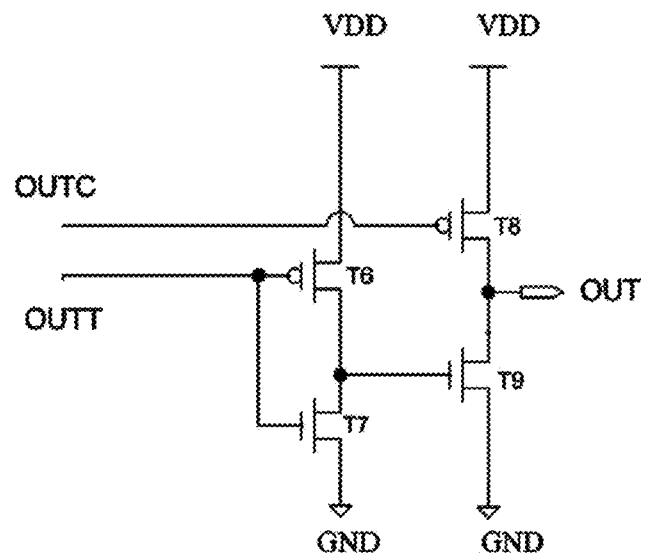
FIG. 3 is a diagram of an output portion of the sense amplifier.

The circuit which comprises transistors T6, T7, T8 and T9 connected between power supply level VDD and GND in FIG. 3 is a specific implementation of the circuit of SA output portion in FIGS. 2A-2C. Wherein, T6 and T7 constitute an inverter, i.e., NOT gate. When T8 is turned off and T9 is turned on, output terminal OUT outputs low level; when T8 is turned on and T9 is turned off, output terminal OUT outputs high level. When both T8 and T9 are turned off, output terminal OUT is in a high resistance state.

Figure 4:
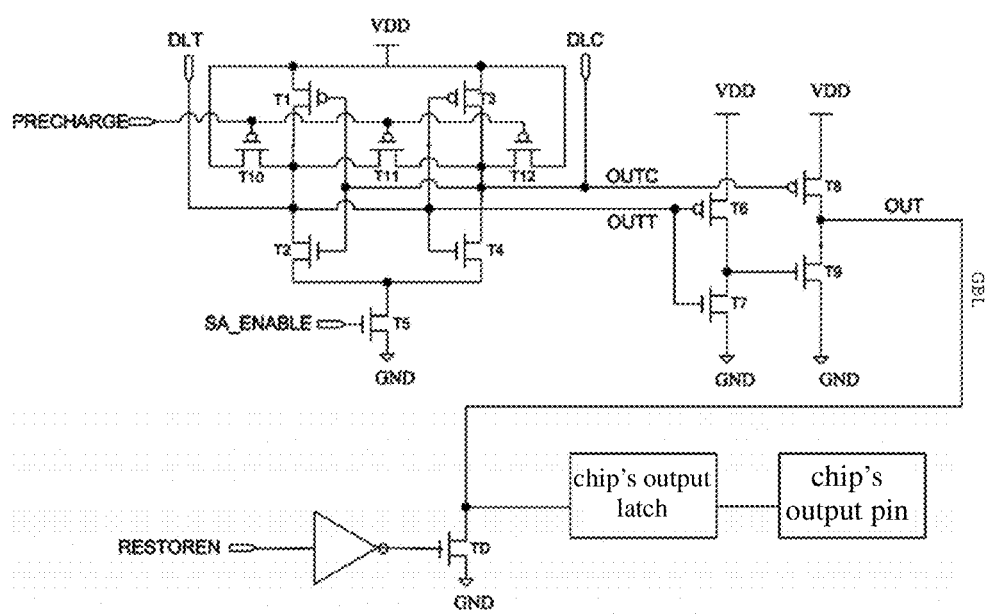
FIG. 4 is a diagram of connecting the sense amplifier to output pin of a chip.

As mentioned above, output of the sense amplifier needs to go through GBL to reach pin of the SRAM chip. FIG. 4 shows how the sense amplifier is connected to an output pin of the SRAM chip. Wherein, the resolving portion of the sense amplifier employs the structure shown in FIG. 2B, and circuit of SA output portion employs the structure shown in FIG. 3. The output OUT of the sense amplifier is connected to GBL, which is connected to an output circuit of the SRAM chip.

The output circuit of the SRAM chip comprises an output latch and a N-type transistor TD. Wherein, one of source and drain of the N-type transistor TD is connected to GBL, and is further connected to input terminal of the output latch. The other of source and drain of the N-type transistor TD is connected to reference level. Gate of the N-type transistor TD is connected to an inverted restore signal RESTROEN. Output terminal of the output latch is connected to a pin of the chip.

The relevant procedure will be described in conjunction with the structure shown in FIG. 4. When there is no read or write operation on SRAM chip, the sense amplifier is made to be inactive by setting SA_ENABLE signal as 0. Pre-charging of the sense amplifier is enabled by setting PRECHARGE signal as 0. Inputs DLT and DLC of the sense amplifier are pulled up to a voltage of power supply level via T10, T11 and T12, such that gate of transistor T9 is at reference level, and gate of transistor T8 is at power supply level. As such, both T8 and T9 are turned off, such that output terminal OUT of the sense amplifier is in a high resistance state. Further, the N-type transistor TD is turned on by setting RESTOREN signal as 0, such that GBL is pulled down to default logic low level.

When a read operation is started, RESTOREN signal is adjusted as 1, such that transistor TD is turned off. As such, level of output terminal OUT of the sense amplifier can be reflected on GBL, and in turn reflected on input terminal of the chip output latch.

During the read operation, one SRAM cell corresponding to the sense amplifier is selected, such that the stored logic value is outputted through BL and BLb. The PRECHARGE signal of the corresponding sense amplifier is adjusted as 1, such that the sense amplifier is not pre-charged any more. DLT and DLC perform resolving according to logic value outputted by the SRAM cell. For example, if a logic value stored in the SRAM cell is 0, then DLC is kept at power supply level while DLT is discharged to a relative low level. After the sense amplifier is made to operate by changing SA_ENABLE to 1, level difference between DLC and DLT is restored by the sense amplifier, such that T8 is turned off and T9 is turned on, thus forming logic low level at output terminal OUT of the sense amplifier. Similarly, if a logic value stored in the SRAM cell is 1, then DLT is kept at power supply level while DLC is discharged to a relative low level. After sense amplifier is made to operate by changing SA_ENABLE to 1, level difference between DLC and DLT is restored by the sense amplifier, such that T8 is turned on and T9 is turned off, thus forming logic high level at output terminal OUT of the sense amplifier.

After the read operation is over, SA_ENABLE signal is changed to 0 such that output terminal OUT of the sense amplifier is again changed to high resistance state. Accordingly, PRECHARGE is changed to 0 such that pre-charging of the sense amplifier is again enabled; RESTOREN signal is changed 0 such that transistor TD is turned on, causing level on GBL to be restored to logic low level.

It can be seen from the above description that, before a read operation is started, level on GBL is logic low level. If logic value stored in the SRAM cell is 0, then level on GBL remains unchanged during the read operation. If logic value stored in the SRAM cell is 1, then level on GBL is changed from logic low level to logic high level during the read operation; and after the read operation is over, level on GBL is restored from logic high level to logic low level. In case that output terminal OUT of the sense amplifier is far from the output latch of the chip, the delay from OUT terminal becoming high level to input terminal of chip's output latch becoming high level will affect improvement in chip read speed.

Those skilled in the art can appreciate that, multiple sense amplifiers may output to a same GBL. In the structure as described above, when a sense amplifier corresponding to a SRAM cell currently being accessed outputs, other sense amplifiers that input to the same GBL are kept at high resistance state. According to embodiments of the invention, when a current sense amplifier corresponding to a SRAM cell currently being accessed outputs logic high level, other sense amplifiers that output to the same GBL as the current sense amplifier are caused to also output logic high level, such that driving capability of the sense amplifier on GBL is increased and the delay from OUT terminal becoming high level to input terminal of chip's output latch becoming high level is reduced.

Figure 5:
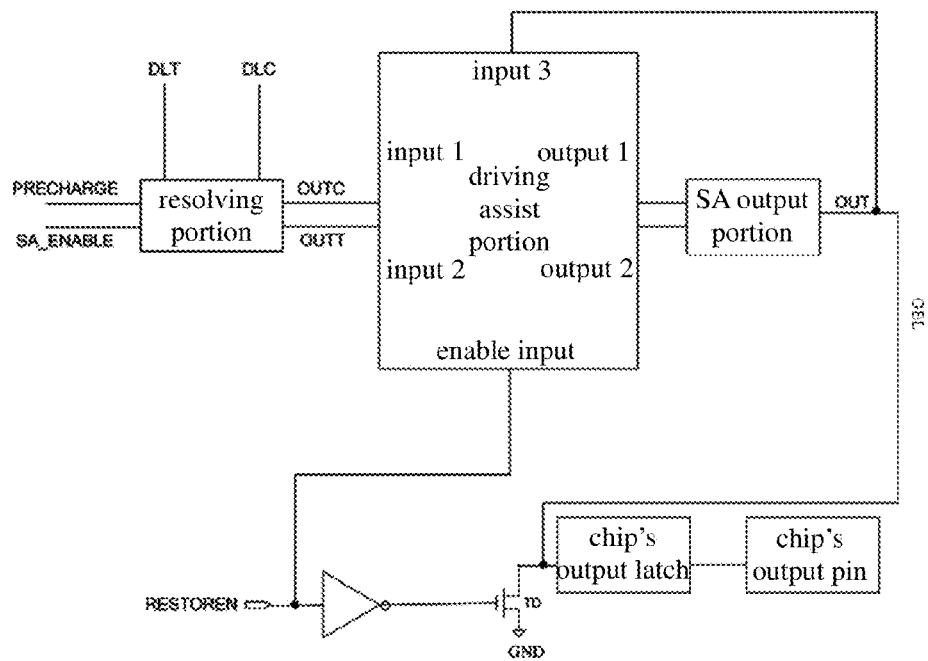
FIG. 5 is a diagram of a sense amplifier according to an embodiment of the invention.

FIG. 5 is a sense amplifier according to an embodiment of the invention. In order to emphasize the distinction of the embodiment of the invention relative to the prior art, same resolving portion and SA output portion as FIG. 4 are employed in FIG. 5, and the resolving portion and SA output portion are only represented in block diagram. FIG. 5 shows one sense amplifier. Those skilled in the art can appreciated that, in multiple sense amplifiers connected to a same GBL, at least two of them have the structure as shown in FIG. 5.

As shown in FIG. 5, OUTC and OUTT are not directly connected to SA output portion as shown in FIG. 4, rather, they are connected to input 1 and input 2 of the driving assist portion. The input 1 and input 2 of the driving assist portion have respectively replaced OUTC and OUTT in FIG. 4 to connect to SA output portion.

When a read operation is performed on a SRAM cell corresponding to that sense amplifier, the driving assist portion determines a signal outputted to SA output portion based on logic value stored in that SRAM. Specifically, if logic value stored in that SRAM is 1, the driving assist portion outputs low level to gate of T8 via output 1, such that T8 is turned on; if logic value stored in that SRAM is 0, the driving assist portion outputs high level to gate of T8 via output 1, such that T8 is turned off. Within the output driving portion, input 2 may be directly connected to output 2, which is equivalent to still directly connecting OUT to SA output portion.

When read operation is performed on SRAM cells corresponding to other sense amplifiers, the driving assist portion determines a signal outputted to gate of T8 based on signal on GBL. If signal on GBL is 1, the driving assist portion outputs low level to gate of T8, such that T8 is turned on. Thus, input 3 of the driving assist portion is connected to output OUT of sense amplifier, i.e. to GBL.

As mentioned above, RESTOREN is a global signal for pulling GBL down to reference level while there is no read operation. Optionally, the RESTOREN signal may be used to distinguish the period during which a read operation is performed from the period during which a read operation is not performed. Since whether signal outputted to gate of T8 is determined based on output of SRAM cell or logic value on GBL, they both occurs during the read operation, therefore, the RESTOREN signal may be used as an enable signal of the driving assist portion. Thus, the driving assist portion may optionally comprise an enable signal input connected to the RESTOREN signal.

Those skilled in the art can appreciate that, an interface between the driving assist portion and the resolving portion, the SA output portion may be changed as needed. For example, if the resolving portion outputs a single end signal, input 1 and input 2 of the driving assist portion may be combined; if the SA output portion receives a single end input signal, output 1 and output 2 of the driving assist portion may also be combined.

Figure 6A:
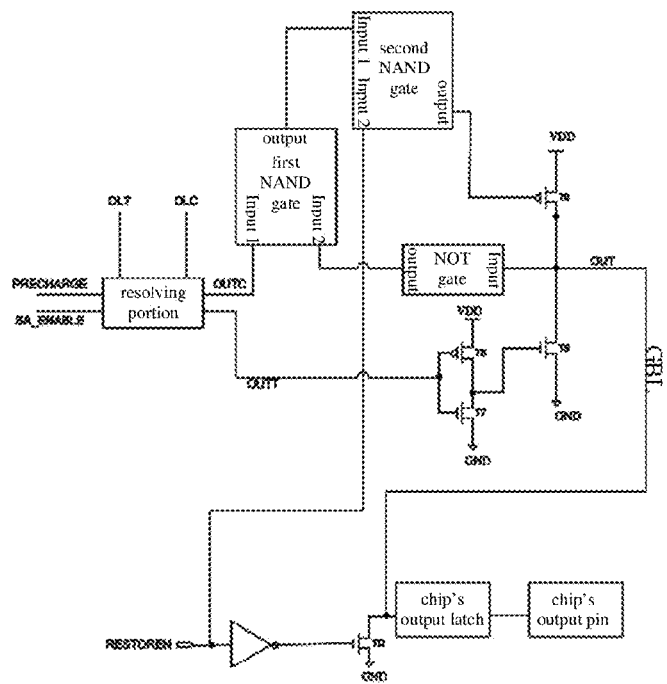
FIGS. 6A and 6B are diagrams of a sense amplifier according to an embodiment of the invention.

FIG. 6A is a sense amplifier according to an embodiment of the invention.

Signal OUTC is connected to input 1 of a first NAND gate. The input 1 of the first NAND gate corresponds to input 1 of the driving assist portion in FIG. 5. A global data bus, after inverted by an inverter, is connected to input 2 of the first NAND gate. Input of the inverter corresponds to input 3 of the driving assist portion in FIG. 5. Output of the first NAND gate is connected to input 1 of a second NAND gate, and RESTOREN is connected to input 2 of the second NAND gate. The input 2 of the second NAND gate corresponds to enable input of the driving assist portion in FIG. 5. Output of the second NAND gate is connected to gate of T8. Output of the second NAND gate corresponds to output 1 of the driving assist portion in FIG. 5. OUTT is connected to gates of T6 and T7, which is equivalent to connecting input 2 of the driving assist portion directly to output 2 of the driving assist portion in FIG. 5.

As mentioned above, before a read operation is started, RESTOREN signal is 0, such that GBL is pulled down to reference level, i.e. logic value 0. Both DLT and DLC are pre-charged to power supply level, i.e. logic value 1. Accordingly, in FIG. 6A, both inputs of the first NAND gate are 1, and output of the first NAND gate is 0; both inputs of the second NAND gate are 0, and output of the second NAND gate is 1. Accordingly, T8 is turned off.

When a read operation is started, RESTOREN is changed to 1, and input 2 of the second NAND gate is changed to 1. Accordingly, output of the second NAND gate depends on its input 1. Specifically, the second NAND gate is equivalent to an inverter with respect to its input 1.

For a current sense amplifier corresponding to a SRAM cell currently being accessed, if logic value stored in the SRAM cell is 1, then DLT is kept at power supply level, and DLC is discharged to a relative low level. Accordingly, OUTC is changed to logic low level, i.e., logic value is 0, such that output of the first NAND gate, i.e. input of the second NAND gate, is changed to logic high level. Further, output of the second NAND gate is changed to logic low level, such that transistor T8 is turned on. Output terminal OUT of the sense amplifier outputs logic value 1.

For the other sense amplifiers, their DLCs are still pre-charged to power supply level, and OUTC is logic high level, i.e. logic value is 1. Since at this point, logic value on GBL is 1, logic value of input 2 of the first NAND gate is 0, such that output of the first NAND gate, i.e. input of the second NAND gate, is made to be logic high level. Further, output of the second NAND gate is changed to logic low level, such that transistor T8 is turned on. Signal strength of output terminal OUT of the sense amplifier is further enhanced, and driving on back-stage is enhanced.

With the structure as shown in FIG. 6A, when one of multiple sense amplifiers outputting to a same GBL outputs logic value 1, other sense amplifiers also output logic value 1, thereby driving GBL together. Under enhanced driving, rate of GBL changing from default logic low level to logic high level is increased, such that speed of the entire read operation is also increased.

Figure 6B:
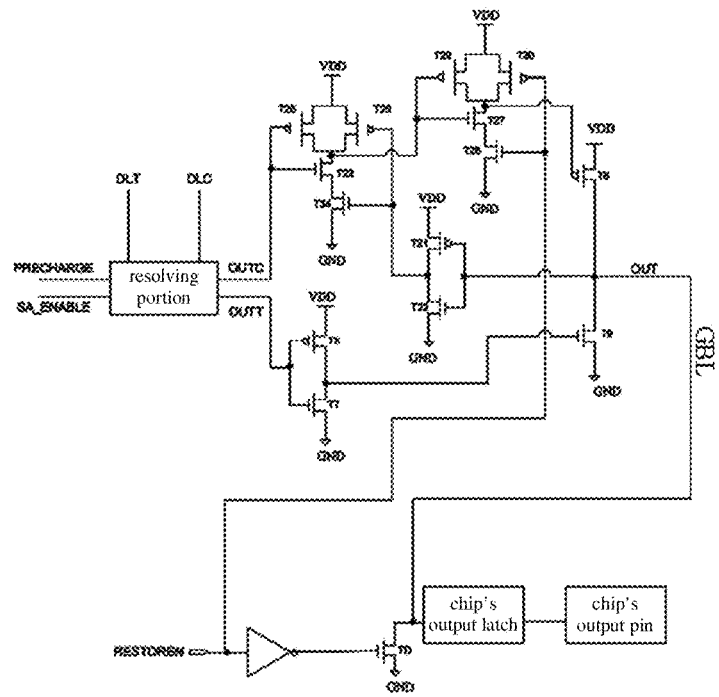

FIG. 6B is an illustrative transistor level implementation of the gate level structure shown in FIG. 6A. Those skilled in the art can design other schemes to realize the NOT gate and NAND gate shown in FIG. 6A.

In FIG. 6B, transistors T21 and T22 constitute a NOT gate, transistors T23-T26 constitute a first NAND gate, and transistors T27-T30 constitute a second NAND gate.

Gates of transistors T25 and T23 are used as input 1 of the first NAND gate. Gates of transistors T24 and T26 are used as input 2 of the first NAND gate. One of source and drain of transistor T25 is connected to power supply level, and the other is connected to output node of the first NAND gate. One of source and drain of transistor T26 is connected to power supply level, and the other is connected to output node of the first NAND gate. One of source and drain of transistor T24 is connected to reference level, and the other is connected to transistor T23. One of source and drain of transistor T23 is connected to output node of the first NAND gate, and the other is connected to transistor T24. Within the second NAND gate, transistors T27-T30 correspond to transistors T23-T26 in the first NAND gate, respectively.

Before a read operation is started, RESTOREN is logic low level, and GBL is pulled down to logic low level. In FIG. 6B, T28 is turned off and T30 is turned on, such that output node of the second NAND gate outputs high level, thus T8 is turned off.

During the read operation, RESTOREN is logic high level, such that T28 is turned on and T30 is turned off.

For the sense amplifier corresponding to a SRAM cell currently being read, if logic value stored in the SRAM cell is 1, OUTC is logic low level, such that T25 is turned on and T23 is turned off, thus output node of the first NAND gate outputs high level to gates of T29 and T27. In case that gate is at high level, T29 is turned off and T27 is turned on, such that output node of the second NAND gate outputs low level to gate of T8. Accordingly, T8 is turned on, such that high level is outputted at output terminal OUT.

For other sense amplifiers that output to the same GBL as the sense amplifier, T21 is turned off and T22 is turned on after GBL is changed to logic high level. Accordingly, the NOT gate outputs low level to gates of T26 and T24, and T26 is turned on and T24 is turned off, such that output node of the first NAND gate outputs high level to gates of T29 and T27. In case that gate is at high level, T29 is turned off and T27 is turned on, such that output node of the second NOT gate outputs low level to gate of T8. Accordingly, T8 is turned on, such that output terminal OUT is further driven to high level.

After the read operation is over, RESTOREN is restored to logic low level, such that GBL is pulled down to logic low level. In FIG. 6B, T28 is turned off and T30 is turned on, such that output node of the second NAND gate outputs high level, thus T8 is turned off.

Figure 7A:
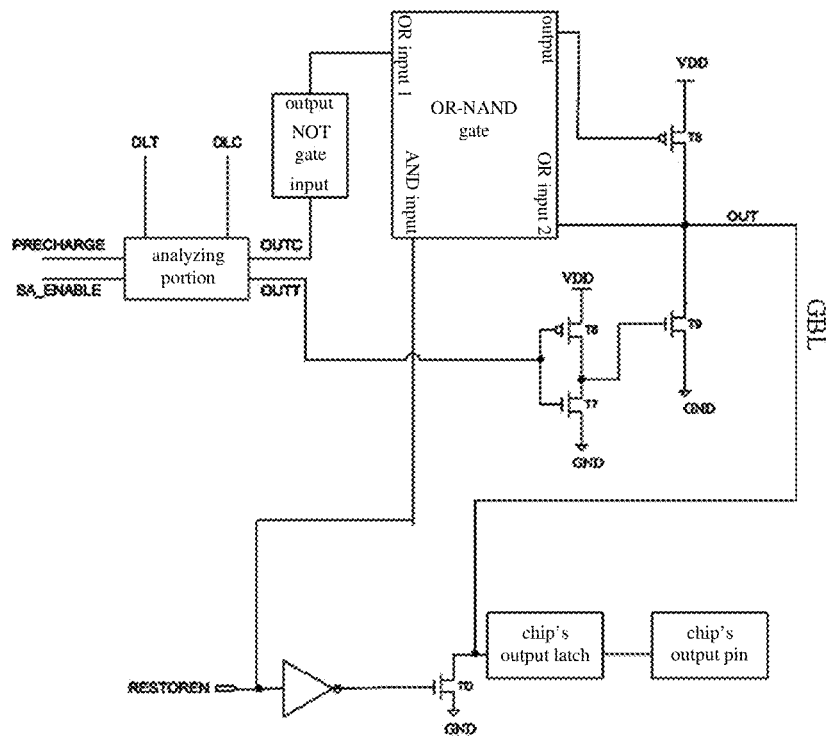
FIGS. 7A and 7B are diagrams of a sense amplifier according to an embodiment of the invention.

FIG. 7A is a sense amplifier according to another embodiment of the invention.

As shown in FIG. 7A, after OUTC passes the inverter, it is connected to OR input 1 of an OR-NAND gate, and output terminal OUT of the sense amplifier is connected to OR input 2 of the OR-NAND gate. RESTOREN signal is connected to AND input of the OR-NAND gate. Output of the OR-NAND gate is connected to gate of T8. Input of the NOT gate corresponds to input 1 of the driving assist portion in FIG. 5, OR input 2 of the OR-NAND gate corresponds to input 3 of the driving assist portion in FIG. 5, output of the OR-NAND gate corresponds to output 1 of the driving assist portion in FIG. 5. AND input of the OR-NAND gate is equivalent to the enable input of the driving assist portion in FIG. 5. OUTT is connected to gates of T6 and T7, which is equivalent to connecting input 2 of the driving assist portion directly to output 2 of the driving assist portion in FIG. 5.

As mentioned above, before the read operation starts, RESTOREN signal is 0, such that GBL is pulled down to reference level, i.e. logic value 0. Both DLT and DLC are pre-charged to power supply level, i.e. logic value 1. Accordingly, in FIG. 7A, both OR inputs of the OR first NAND gate are 0, and AND input of the OR-NAND gate is also 0, and then output of the OR first NAND gate is 1. Accordingly, T8 is turned off.

When the read operation is started, RESTOREN is changed to 1, and AND input of the OR-NAND gate is changed to 1. Accordingly, output of the OR second NAND gate depends on its input. Specifically, if any one of OR inputs of the OR-NAND gates is 1, output of the OR-NAND gate is 0, i.e. logic low level.

For the current sense amplifier corresponding to a SRAM cell currently being accessed, if logic value stored in the SRAM cell is 1, DLT is kept at power supply level, and DLC is discharged to a relative low level. Accordingly, OUTC is changed to logic low level, i.e., logic value is 0, one OR input of the OR-NAND gate is changed to logic high level. Further, output of the OR-NAND gate is changed to logic low level, such that transistor T8 is turned on. Output terminal OUT of the sense amplifier outputs logic value 1.

For other sense amplifiers that output to the same GBL as the sense amplifier, their DLCs are still pre-charged to power supply level, and OUTC is logic high level, i.e. logic value is 1, thus one OR input of the OR-NAND gate is logic low level 0. However, since logic value on GBL is 1 at this point, logic value of the other OR input of the OR-NAND gate is 1, such that output of the OR-AND gate, i.e. input of the second NAND gate, is changed to logic low level, thus transistor T8 is turned on. Output terminal OUT of the sense amplifier also outputs logic value 1, thereby enhancing the driving ability on GBL.

With the structure shown in FIG. 7A, the following can also be achieved: when one of multiple sense amplifiers outputting to a same GBL outputs logic value 1, other sense amplifiers are also made to output logic value 1, thereby driving GBL together.

Figure 7B:
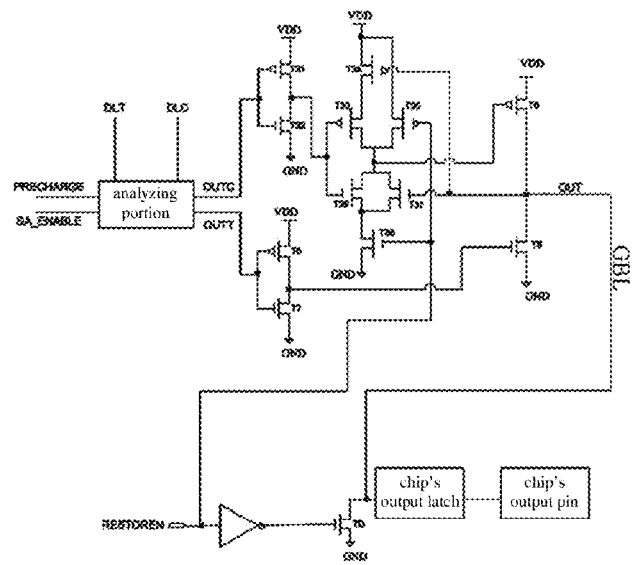

FIG. 7B is an illustrative transistor level implementation of the gate level structure shown in FIG. 7A. Those skilled in the art can design other schemes to realize the NOT gate and OR-NAND gate as shown in FIG. 7A.

In FIG. 7B, transistors T31 and T32 constitute a NOT gate, transistors T33-T38 constitute an OR-NAND gate. Wherein, gates of transistors T33 and T36 are used as OR input 1 of the OR-NAND gate, and are connected to output of the NOT gate; gates of transistors T34 and T37 are used as OR input 2 of the OR-NAND gate, and are connected to GBL. Gates of T35 and T38 are used as AND input of the OR-NAND gate, and are connected to RESTORE. One of source and drain of each of T33, T35, T36 and T37 is connected to output node of the OR-NAND gate. The other of source and drain of T33 is connected to one of source and drain of T34, and the other of source and drain of T34 is connected to power supply level. The other of source and drain of T35 is connected to power supply level. The other of source and drain of T36 and the other of source and drain of T37 are both connected to one of source and drain of T38. The other of source and drain of T38 is connected to reference level.

Before a read operation is started, RESTOREN is logic low level, such that T35 is turned on and T38 is turned off. At this time, output of the OR-NAND gate is high level, such that T38 is turned off.

After the read operation is started, RESTOREN is logic high level, such that T35 is turned off and T38 is turned on.

For the sense amplifier corresponding to a SRAM cell currently being read, if logic value stored in the SRAM cell is 1, OUTC is logic low level and which, after being inverted, causing T33 being turned off and T36 being turned on. Since RESTOREN has caused T35 to be turned off and T38 to be turned on, output node of the OR-NAND gate outputs low level to gate of T8. Accordingly, T8 is turned on, such that high level is outputted at output terminal OUT.

For other sense amplifiers that output to the same GBL as the sense amplifier, T37 is turned on and T34 is turned off after GBL is changed to logic high level. Since RESTOREN has caused T35 to be turned off and T38 to be turned on, output node of the OR-NAND gate outputs low level to gate of T8. Accordingly, T8 is turned on, such that high level is outputted at output terminal OUT.

Figure 8:
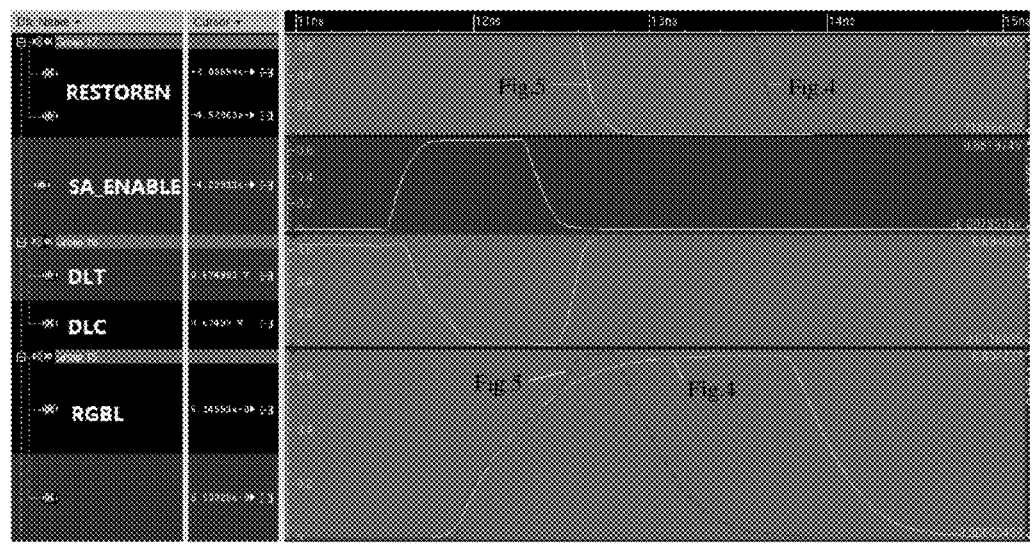
FIG. 8 is a graph illustrating experimental result of performance improvement in the sense amplifier.

FIG. 8 is a comparison between output characteristic of the sense amplifier according to embodiments of the invention and output characteristic of traditional sense amplifier.

In FIG. 8, far end GBL, i.e. RGBL, represents signal at input terminal of chip's output latch. As mentioned above, there may be a large distance between this location and output terminal of the sense amplifier. It can be seen from FIG. 8 that, signal's speed of rising from logic low level to logic high level at input terminal of chip's output latch is increased. Accordingly, the period during which RESTOREN keeps1 may also be reduced. This means that, the time of read operation is reduced.

As mentioned above, in case that current sense amplifier is far away from input terminal of chip's output latch, the present invention utilizes sense amplifiers near that current sense amplifier as assisted sense amplifiers and drive GBL together with that current sense amplifier. Those skilled in the art can appreciate that, in the process that signal on GBL is changed from logic low level to logic high level, that is, during logic value 1 is propagated from output terminal of the current sense amplifier to input terminal of chip's output latch, the nearer an assisted sense amplifier to the current sense amplifier, the earlier it begin to drive the GBL due to GBL is changed to logic high level, such that it has more contribution in increasing signal change rate at input terminal of chip's output latch. On the other hand, only in case that current sense amplifier is far away from input terminal of chip's output latch, there is a need for help from assisted sense amplifiers. Thus, according to an embodiment of the invention, a first threshold is set. For a sense amplifier whose distance to input terminal of chip's output latch exceeds the first threshold, the structures shown in FIGS. 5-7B are used; while for a sense amplifier whose distance to input terminal of chip's output latch does not exceed the first threshold, traditional sense amplifier structure will be used. This, on one hand, may reduce additional area overhead due to adding the structures as shown in FIGS. 5-7B; and on the other hand, may reduce additional power consumption due to driving GBL concurrently by multiple sense amplifiers. The first threshold may be a distance from output terminal of the sense amplifier to input terminal of chip's output latch, or may be number of other sense amplifiers between output terminal of the sense amplifier and input terminal of chip's output latch.

Figure 9:
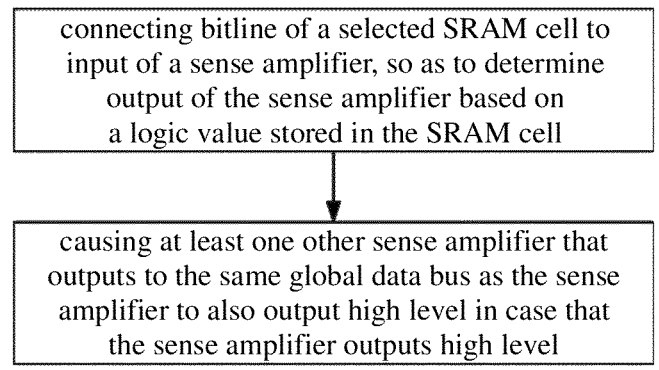
FIG. 9 is a flowchart of a method of performing read operation on a SRAM chip according to embodiments of the invention.

FIG. 9 is a flowchart of a method of performing read operation on a SRAM chip according to embodiments of the invention.

The method comprising:
connecting bitline of a selected SRAM cell to input of a sense amplifier, so as to determine output of the sense amplifier based on a logic value stored in the SRAM cell;
causing at least one other sense amplifier that outputs to the same global data bus as the sense amplifier to also output high level in case that the sense amplifier outputs high level.

As mentioned above, enhanced driving capability may only be provided to those sense amplifiers which are far away from output pin of the chip. Accordingly, at least one other sense amplifier that outputs to the same global data bus as the sense amplifier is caused to also output high level in case that a distance between the sense amplifier and output pin of the SRAM chip exceeds a first threshold.

Although respective devices of the invention have been described above in detail in connection with specific embodiments, the invention is not limited thereto. Those skilled in the art can change, alter and modify the invention in various ways upon taught by the description without departing from the scope and spirit of the invention. It should be appreciated that, all such changes, alterations and modifications still fall into protection scope of the invention defined by appended claims.

What is claimed is:

1. A sense amplifier comprising:
a resolving portion, input of which is connected to output of a storage cell corresponding to the sense amplifier, and output of which is connected to input of a driving assist portion;
an output portion, input of which is connected to output of the driving assist portion, and output of which is connected to a global data bus of a chip;
the driving assist portion, which further takes the global data bus as input, the driving assist portion is configured to cause the output portion to output high level in following conditions:
a logic value stored in the storage cell corresponds to outputting high level on the global data bus while a read operation is performed on the storage cell;
at least one other sense amplifier that outputs to the same global data bus as the sense amplifier outputs high level while the storage cell is not being accessed.

2. The sense amplifier according to claim 1, wherein the driving assist portion further comprises an enable input connected to a restore signal of the global data bus.

3. The sense amplifier according to claim 2, wherein the output of the resolving portion comprises a first output and a second output, the input of the output portion comprises a first input and a second input, and the driving assist portion comprises a first input, a second input, a third input, a first output and a second output;
the first output of the resolving portion is connected to the first input of the driving assist portion;
the second output of the resolving portion is connected to the second input of the driving assist portion;
the first output of the driving assist portion is connected to the first input of the output portion;
the second output of the driving assist portion is connected to the second input of the output portion;
the third input of the driving assist portion is connected to the global data bus;
the second input of the driving assist portion is connected to the second output of the driving assist portion.

4. The sense amplifier according to claim 3, the driving assist portion comprises a first NAND gate, a second NAND gate and a NOT gate, wherein:
a first input of the first NAND gate is connected to the first input of the driving assist portion;
a second input of the first NAND gate is connected to an output of the NOT gate;
an input of the NOT gate is connected to the third input of the driving assist portion;
a first input of the second NAND gate is connected to an output of the first NAND gate;
a second input of the second NAND gate is connected to the enable input;

an output of the second NAND gate is connected to the first output of the driving assist portion.

5. The sense amplifier according to claim 3, wherein the driving assist portion comprises a NOT gate and an OR-NAND gate, wherein:
- an input of the NOT gate is connected to the first input of the driving assist portion;
- an output of the NOT gate is connected to a first OR input of the OR-NAND gate;
- a second OR input of the OR-NAND gate is connected to the third input of the driving assist portion;
- an AND input of the OR-NAND gate is connected to the enable input of the driving assist portion;
- an output of the OR-NAND gate is connected to the first output of the driving assist portion.

6. A SRAM chip comprising the sense amplifier according to claims 1.

7. The SRAM chip according to claim 6, wherein a distance between the sense amplifier and output pin of the SRAM chip is greater than a first threshold.

8. A method of performing read and write operation on a SRAM chip, comprising:
- connecting bitline of a selected SRAM cell to input of a sense amplifier, so as to determine output of the sense amplifier based on a logic value stored in the SRAM cell;
- causing at least one other sense amplifier that outputs to the same global data bus as the sense amplifier to also output high level in case that the sense amplifier outputs high level.

9. The method according to claim 8, wherein causing at least one other sense amplifier that outputs to the same global data bus as the sense amplifier to also output high level comprises:
- causing at least one other sense amplifier that outputs to the same global data bus as the sense amplifier to also output high level in case that a distance between the sense amplifier and output pin of the SRAM chip exceeds a first threshold.

* * * * *